United States Patent

Provost et al.

[11] Patent Number: 5,245,283
[45] Date of Patent: Sep. 14, 1993

[54] TECHNIQUE FOR SHIFTING OUT-OF-SLICE ARTIFACTS TO THE EDGE OF THE FIELD OF VIEW

[75] Inventors: Terrence J. Provost, Cleveland Heights; Kenneth S. Foster, Mentor, both of Ohio

[73] Assignee: Picker International, Inc., Highland Heights, Ohio

[21] Appl. No.: 741,122

[22] Filed: Aug. 7, 1991

[51] Int. Cl.$^5$ .............................................. G01R 33/20
[52] U.S. Cl. ...................................................... 324/309
[58] Field of Search .............. 324/300, 307, 312, 309, 324/306, 318, 322; 128/653.2, 653.5

[56] References Cited

U.S. PATENT DOCUMENTS

| | | | |
|---|---|---|---|
| 4,484,138 | 11/1984 | Bottomley et al. | 324/307 |
| 4,706,023 | 11/1987 | Den Boef | 324/309 |
| 4,959,611 | 9/1990 | Provost et al. | 324/309 |
| 4,962,357 | 10/1990 | Sotak | 324/309 |
| 4,994,743 | 2/1991 | Glover et al. | 324/309 |
| 5,027,072 | 6/1991 | Rinaldi | 324/312 |
| 5,093,619 | 3/1992 | Hennig | 324/306 |
| 5,101,156 | 3/1992 | Pelc | 324/306 |

FOREIGN PATENT DOCUMENTS

| | | |
|---|---|---|
| 0145277 | 11/1984 | European Pat. Off. . |
| 0182267 | 11/1985 | European Pat. Off. . |
| 0205199 | 5/1986 | European Pat. Off. . |
| 0253446 | 7/1987 | European Pat. Off. . |
| 0329299 | 1/1989 | European Pat. Off. . |
| 3636251 | 10/1985 | Fed. Rep. of Germany . |

Primary Examiner—Michael J. Tokar
Attorney, Agent, or Firm—Fay, Sharpe, Beall, Fagan, Minnich & McKee

[57] ABSTRACT

A magnetic resonance imaging sequence (FIG. 2) is applied with a phase encode gradient (60) between an RF excitation pulse (50) and a refocusing pulse (54) such that out-of-slice artifacts are collapsed into a single line or column (64) in a resultant image display (38). A digital radio frequency transmitter (20) adds an adjustable RF phase component (70) to the excitation pulse and digital radio frequency receiver (26) adds the inverse or negative of the phase component (72) to a received magnetic resonance echo (56). The RF phase increment is adjusted such that the artifact line is displayed at the edge or other selected portion of the resultant image away from a region (74) of primary interest. An operator control (80) enables the field of view to be shifted in the phase encode direction to view different portions of the patient along the phase encode axis. As the field of view is translated, the RF phase increment is adjusted correspondingly and the reconstructed image representation is rebinned (82) such that the artifact line remains at the edge of the image display.

11 Claims, 2 Drawing Sheets

TECHNIQUE FOR SHIFTING OUT-OF-SLICE ARTIFACTS TO THE EDGE OF THE FIELD OF VIEW

BACKGROUND OF THE INVENTION

The present invention relates to the art of image artifact correction. It finds particular application in conjunction with removing out-of-slice artifacts from critical regions of an imaging volume in single signal average scans offset in the phase encode direction and will be described with particular reference thereto.

Heretofore, medical diagnostic images have commonly included ghosts or artifacts from various sources including edge information, eddy currents, and signals emanating from out of the selected slice.

One technique for removing these artifacts was to place symmetric spoiler gradients around the 180° refocusing pulse. The symmetric gradients had the effect of selectively dephasing signals originating from the 180° pulse itself. See, for example, U.S. Pat. No. 4,484,138 to Bottomley, et al. Although effective in removing artifacts originating from the 180° refocusing pulse, the application of the symmetric gradients had numerous disadvantages. First, these gradients, which were added solely for artifact elimination, increased the time required to perform an imaging sequence. The time used to eliminate the artifacts increased the minimum echo time which the imaging system could attain. Increasing the minimum echo time leads to decreased signal to noise and may reduce the total number of slices which can be acquired in a given repeat time, i.e. reduces slice throughput. The time required for the symmetric gradients shortens the allowable read gradient time for short echo times. This decrease in the read gradient time limited the minimum achievable field of view and decreased the sequence signal to noise ratio. The application of the symmetric gradients increased the RMS current and power dissipation requirements in the gradient amplifiers, reducing slice throughput. Moreover, the symmetric gradients do not totally eliminate the out-of-slice artifacts. Residual out-of-slice artifacts still overlap the region of interest.

Many of the disadvantages of the spoiler gradient technique can be overcome by estimating the out-of-slice artifact and subtracting it from the data set. That is, a data set is generated from the sample without using phase encode gradients. Without phase encode gradients, the resultant data set should form a blank image. However, the resultant "blank" image includes out-of-slice artifacts, such as those artifacts attributable to eddy currents induced by the imaging sequence. This technique is described in greater detail in U.S. Pat. No. 4,959,611 to the inventors herein. Although curing many of the drawbacks of this gradient spoiling technique, this technique still has some drawbacks. First, the phase encode gradients themselves cause eddy current changes. This changes the artifacts in the actually collected image relative to the "blank" image. When the "blank" image or correction data is subtracted, the out-of-slice artifacts do not cancel completely. Because the out-of-slice artifact estimate is always imperfect, residual artifacts will continue to occur and these artifacts often overlap the region of interest in the imaging volume. That is, the artifacts or ghosts tend to be superimposed at least in part on the region of data that is being analyzed.

Prior art analog radio frequency transmitters commonly had a DC component or offset. This DC offset was removed from the resultant magnetic resonance data by alternating the phase of the RF excitation pulse by 180°. That is, in odd number sequence repetitions, for example, the RF excitation pulse had a +90° phase offset and in even numbered sequence repetitions, the RF excitation pulse at a −90° phase offset. This reversed the polarity of the DC offset such that the DC offsets canceled. One side effect to this technique for removing the DC offset is that it shifted out-of-slice artifacts or ghosts one-half a field of view in the phase encode direction relative to the isocenter of the magnetic resonance imager.

Modern magnetic resonance scanners use digital, rather than analog, RF transmitters. The digital transmitters do not introduce a DC component, hence the ±90° phase cycling is not needed to eliminate DC offset.

In accordance with the present invention, a new and improved imaging technique is provided in which out-of-slice artifacts are shiftable consistently to a selectable region of the field of view, even when the field of view is translated relative to the isocenter of the imager.

SUMMARY OF THE INVENTION

In accordance with the present invention, the phase of the RF excitation pulse and the phase of the received resonance signal are shifted for the explicit purpose of moving the out-of-slice artifacts to non-critical regions of the imaging field of view.

In accordance with a more limited aspect of the invention, the phase offset is precisely calculated to shift the out-of-slice artifacts to a selected location within the field of view.

In accordance with a more limited aspect of the present invention, the phase encode gradient pulse is applied prior to the 180° refocusing RF pulse such that the out-of-slice artifacts are collapsed into a line. The phase of the RF excitation pulse is shifted, by the same amount in every repetition for the selected field of view, such that the artifact line is shifted to the edge of the selected field of view.

In accordance with a more limited aspect of the present invention, the collected data is phase shifted by the same phase angle, but of the opposite sign, during data collection and read out. The reconstructed image is rebinned to apply the desired field of view offset or shifting.

In accordance with a more limited aspect of the present invention, as the field of view is offset or translated in the phase encode direction, the phase of the 90° RF excitation pulse is shifted by a corresponding amount.

One advantage of the present invention resides in its minimal echo and repeat times. No sequence time is required to perform the artifact elimination function.

Another advantage of the present invention is that it improves the signal to noise ratio, either by reducing echo times or sampling bandwidth.

Another advantage of the present invention is its read gradients may be reduced. The minimum field of view can be reduced for short echo times.

Another advantage of the present invention resides in the reduced RMS current and power dissipation requirements in the gradient amplifiers.

Another advantage of the present invention is that it is insensitive to eddy currents.

Yet another advantage of the present invention is that it permits arbitrary translation or offsetting of the field of view in the phase encode direction without image degradation from the superimposition of the desired invention with artifacts or ghosts.

Yet another advantage of the present invention is that the effects of diffusion are reduced.

Still further advantages of the present invention will become apparent to those of ordinary skill in the art upon reading and understanding the following detailed description of the preferred embodiments.

BRIEF DESCRIPTION OF THE DRAWINGS

The present invention may take form in various steps and combinations of steps and in various components and arrangements of components. The drawings are only for purposes of illustrating a preferred embodiment and are not to be construed as limiting the invention.

DETAILED DESCRIPTION OF THE PREFERRED EMBODIMENT

Figure 1:
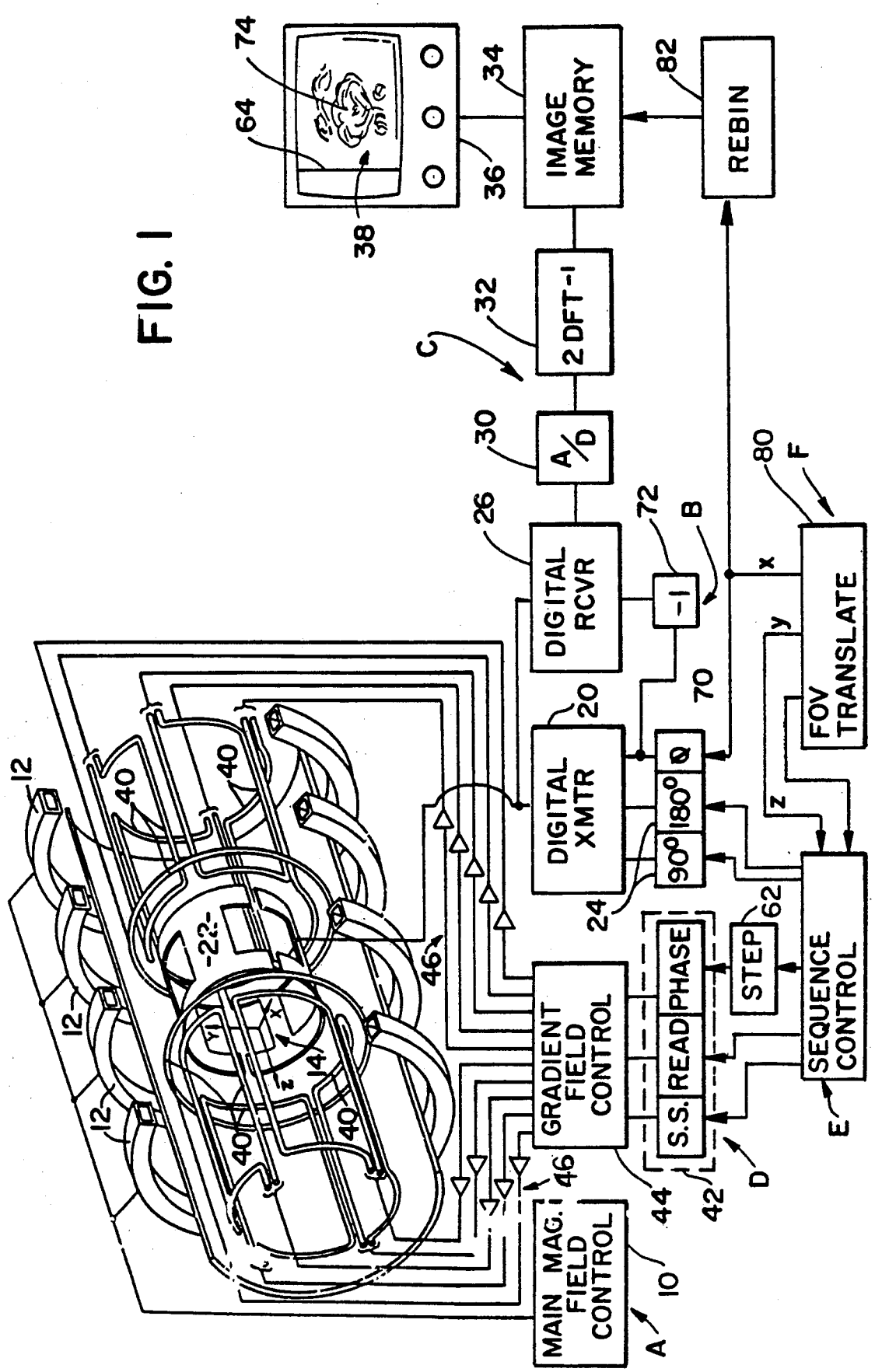
FIG. 1 is a diagrammatic illustration of a magnetic resonance imaging system in accordance with the present invention.

With reference to FIG. 1, a magnetic resonance imaging apparatus includes a main magnetic field source A for creating a generally uniform magnetic field through an examination region. A radio frequency means B selectively transmits 90° radio frequency excitation pulses for exciting selected dipoles within the region of residence. The radio frequency means also provides 180° refocusing pulses for inducing a magnetic resonance echo and other RF pulse for selectively manipulated magnetization components. The radio frequency means further receives magnetic resonance signals that are reconstructed by an image processing means C into an electronic image representation for archiving, displaying, or the like. A gradient field of means D selectively imposes gradient fields, preferably along three orthoganal axis, across the examination region. A pulse sequence control means E controls the radio frequency and gradient means to cause the generation of preselected pulse sequences, such as the sequence of FIG. 2. A field of view translating means F selectively shifts the field of view. That is, selectively changes the slice of the region within a patient which the image representation depicts.

The magnetic field means A includes a control circuit 10 and a plurality of superconducting or resistive magnetic field coils 12 for generating the primary magnetic field. The control circuit causes the magnets to generate a substantially uniform magnetic field axially through an examination or image region 14. Magnetic field shimming devices (not shown), as are conventional in the art, may be provided for improving the uniformity of the magnetic field.

The radio frequency means B includes a digital radio transmitter 20 that selectively applies radio frequency pulses to an RF coil 22 surrounding the examination region. A transmitter memory 24 stores the appropriate digital descriptions of 90°, 180°, and other RF pulses which the digital transmitter can be called upon to apply. In addition to the tip angle of the RF pulses, the digital transmitter is controlled to apply RF pulses with a selected phase. A digital radio frequency receiver 26 receives magnetic resonance signals at least during an induced a magnetic resonance echo. The digital radio frequency receiver processes the received magnetic resonance signal to remove a selected carrier frequency to add or subtract a phase offset, and the like. A magnetic resonance signal received during each magnetic resonance echo is converted by the receiver into a view to be processed by the image processing means C. Although a digital transmitter and receiver is preferred, one or both may be analog.

The image processing means C includes an analog to digital converter 30 which digitizes each view from the receiver 26. An image reconstruction means, such as an inverse two dimensional Fourier transform processor 32 reconstructs the views into an image representation that is stored in an image memory 34. A video monitor 36 selectively converts the image representation stored in the image memory into a man-readable display 38.

The gradient field of means D includes gradient coils 40 for causing gradients across the main magnetic field in the examination region 14 at selectable angles. A gradient memory means 42 stores descriptions of preselected slice select gradients, read gradients, and arrays of phase encode gradients. A gradient control means 44 configures the selected slice select, read, and phase encode gradients into appropriate current pulses which are amplified by an array of gradient amplifiers 46 and applied of the gradient coils 40.

Figure 2:
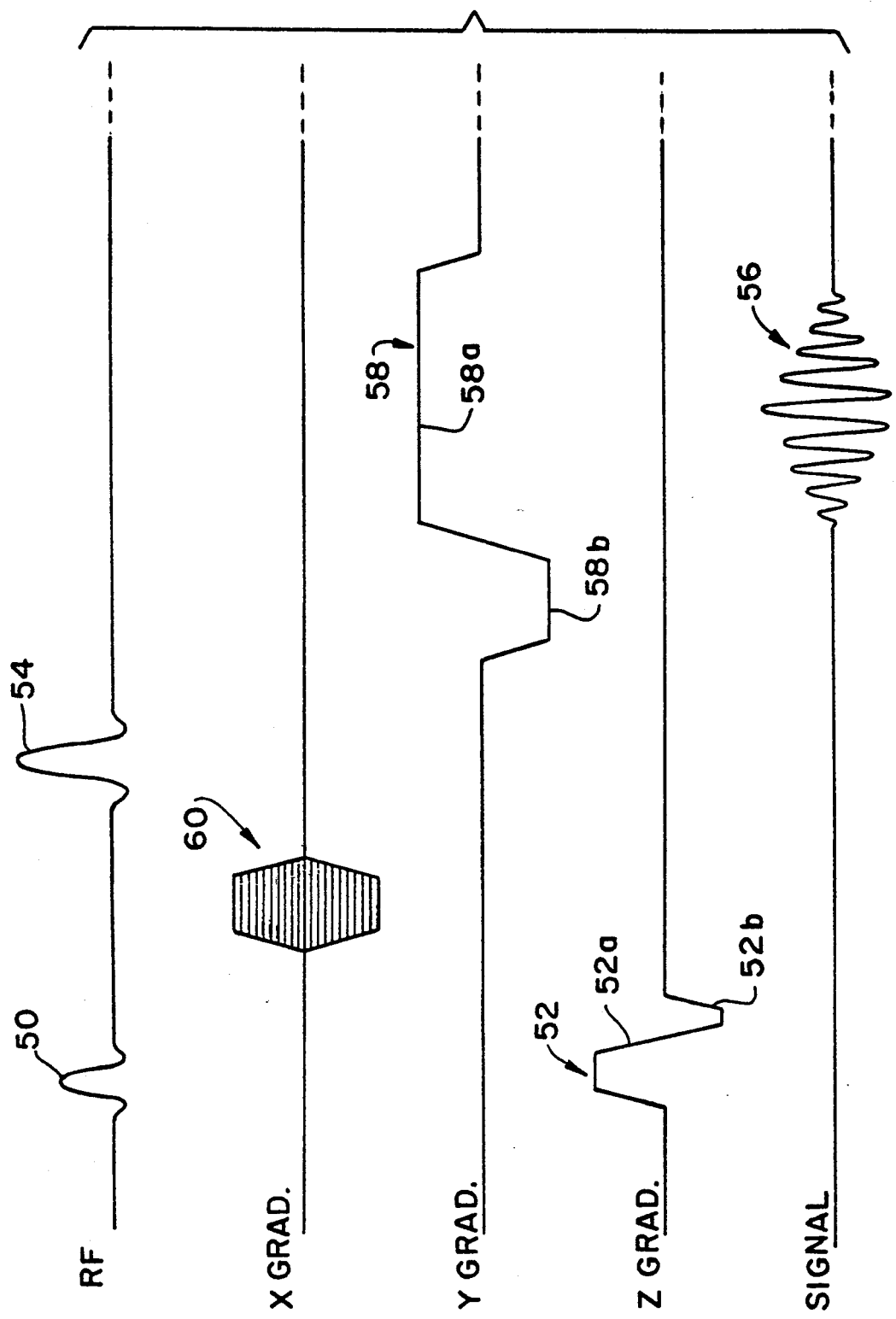
FIG. 2 is an illustration of a preferred imaging sequence for implementation of the scanner of FIG. 1.

With reference to FIG. 2, the sequence control means E, in the preferred embodiment, controls the digital RF transmitter 20 and the gradient field control means 44 such that a 90° excitation RF pulse 50 and a slice select gradient pulse 52 are applied concurrently. More specifically, the slice select gradient pulse has a slice select component 52a which is centered around the 90° RF resonance excitation pulse 50 and a dephasing gradient component 52b for refocusing the signal. Following the 90° RF pulse, a 180° refocusing pulse 54 is applied by the digital transmitter 20. The refocusing pulse refocuses the magnetization resonance induced by the 90° pulse to form a magnetic resonance echo 56 which occurs the same duration after the 180° pulse by which the 90° precedes the 180° pulse. A read gradient 58 is induced concurrently with the magnetic resonance echo 56. The read gradient has a rephasing component 58a which precedes read gradient component 58b which is concurrent with the magnetic resonance echo 56.

The sequence control means E further causes the gradient control 44 to apply a phase encode gradient from a phase encode gradient array 60. A stepping means 62 may be provided such that in subsequent repetitions of the sequence, the applied phase encode gradient is stepped through the array. In this manner, a plurality of repetitions of the sequence cause a plurality of different phase encoded views to be sent from the digital receiver 26 to the image processing means C. The phase encode gradient may be placed either between the excitation pulse 50 and the refocusing pulse 54 or between refocusing pulse and the echo. When the phase encode gradient is placed between the refocusing pulse and the echo, the out-of-slice artifact appears as a ghost image spread over numerous pixels of the image. However, when the phase encode gradient is applied between the excitation and refocusing pulses, the out-of-slice artifact collapses into a single column (or row) of pixels orthoganal to the phase encode direction. Because effectively the entire out-of-slice artifact has been collapsed into the single column, that column appears in the image 38 as a very distinct and strong line artifact 64 which obliterates the underlying column of the image.

An RF phase increment means 70 controls the phase of the RF signal generated by the digital transmitter 20. A phase inverting means 72 changes the sign of the phase and provides it to the RF receiver 26. The receiver changes the phase the received magnetic resonance signal by the corresponding amount. The sign reversal of the receiver phase arises from the effect of the refocusing pulse 54, whose phase is not incremented. As the RF phase is selectively adjusted, the artifact line is shifted across the field of view. Because a region of primary 74 interest is normally displayed in the center of the field of view or displayed image 38, the artifact line in the preferred embodiment is shifted to the edge of the field of view.

The radio frequency phase increment applied by the RF phase means 70 is initially calibrated with the field of view centered on the isocenter of the examination region 14. The field of view translating means F includes an operator control 80 for selectively shifting the field of view relative to the x, y, or z axes. To offset in the y or read direction and in the z or slice select direction, the field of view translating means offsets the resonance frequency during the read and slice select, respectively. To step in the x or phase encode direction, a rebinning means 82 shifts columns of pixels from one end of the image to the other. The image representation is cyclic in $2\pi$. Thus, the image may be conceptualized as a cylinder which is cut vertically and opened flat for display. The rebinning means 82 shifts the column along which the cylinder is cut. When conceptualizing the image representation as a planar, two dimensional ray of data values, the rebinning means successively moves data values from vertical, y direction columns at one end of the image memory to the opposite end.

It should be noted that the RF phase increment size depends on the trajectory through K-space, specifically the gradient phase encoding order. In the preferred embodiment, the data space is covered by scanning from a maximum positive phase encoding gradient, through 0, to a negative minimum phase encode gradient, i.e. a negative gradient with the maximum of magnitude.

The size of the RF phase increment is determined by the translation of the desired field of view in the phase encoding direction or directions (in three and four dimensional imaging). For a selected translation in the phase encode direction $T_{PE}$, the transmit phase increment $\phi_t$ is:

$$\phi_t = (T_{PE} - FOV/2)/FOV * 360° \qquad (1)$$

Note that scanning from the negative minimum to the positive maximum would result in the RF phase increment of being multiplied by $-1$. In a magnetic resonance imaging system, the field of view is cyclic in $2\pi$. When data $f(x)$ is translated by an amount $x_0$ in the x or phase encode direction, its fourier transform (FT) is phase shifted by a comparable amount, i.e.:

$$FT(f(x - x_0)) = FT(f(x))e^{2\pi \frac{iux_0}{N}}$$

where u is dimensionality constant for the physical size within the patient represented by each pixel of the display image 38 and N is the number of pixels in the x or phase encode direction along the field of view. Thus, the phase term shifts by $x_0/N$, i.e. the fraction of the field of view which the field of view was translated in the phase encode direction.

As a field of view translating means F translates the field of view in the x direction, the rebinning means 82 causes the image representation in the image memory 34 to be rebinned. This rebinning as the field of view is translated keeps the artifact line 64 at the edge or other selected point of the display 38.

Although described in terms of a two dimensional image representation, the present invention is equally applicable to three dimensional and four dimensional data. Moreover, the invention may also be used with multiple echo sequences. Although positioning of the artifact line at the edge of the field of view is preferred, the present invention does contemplate that the artifacts may be moved to any selected location within the field of view.

The invention has been described with reference to the preferred embodiments. Obviously, modifications and alterations will become apparent to those of ordinary skill in the art upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. In a method of diagnostic imaging in which a radio frequency pulse is applied to excite magnetic resonance which resonance is phase and frequency encoded, and in which a magnetic resonance signal is received and reconstructed into an image, the IMPROVEMENT COMPRISING:
   adding a phase increment to a radio frequency excitation pulse and a received resonance signal for selectively moving image degradation attributable to imperfections in the radio frequency pulses to an edge of an image reconstructed from the received resonance signals.

2. A method of diagnostic imaging, the method comprising:
   (a) applying a radio frequency excitation pulse for exciting magnetic resonance of selected dipoles within an examination region;
   (b) phase encoding the excited magnetic resonance;
   (c) refocusing the magnetic resonance to cause a magnetic resonance echo;
   (d) converting the magnetic resonance echo into a view of magnetic resonance data;
   (e) repeating steps (a)-(d) with each of a plurality of phase encode gradients to generate a plurality of different phase encoded views;
   (f) reconstructing the plurality of views into an image representation;
   (g) selectively incrementing a phase of the radio frequency excitation pulse and the generated magnetic resonance views by an RF phase increment which shifts artifacts attributable to imperfections in the radio frequency pulse to a selected region of the image representation, the RF phase increment being the same in each repetition of steps (a)-(d).

3. The method as set forth in claim 2 wherein the phase encoding step includes applying a phase encode gradient after the radio frequency excitation pulse is applied and before refocusing such that the artifacts are collapsed into a line and wherein the RF phase increment is selected such that the artifact line is shifted to an edge of the image representation.

4. The method as set forth in claim 2 further including:
- selectively shifting a field of view in at least a phase encode direction to image a different region of the subject and repeating steps (a)-(f); and
- concurrently with the shifting the field of view, changing the RF phase increment such that the artifacts remains at the selected region of the image representation.

5. The method as set forth in claim 4 further including, as the field of view is translated, shifting columns of image pixel values from one edge of the image representation to an opposite edge.

6. A diagnostic imaging apparatus comprising:
- a radio frequency transmitter means for applying radio frequency pulses for inducing magnetic resonance of selected dipoles within an examination region and for refocusing the magnetic resonance to cause a magnetic resonance echo;
- a means for applying a phase encode gradient pulse for phase encoding the induced magnetic resonance;
- a radio frequency receiver for converting the magnetic resonance echo into a view of magnetic resonance data;
- an image processing means for reconstructing the plurality of differently phase encoded views into an image representation;
- an RF phase adjusting means for selectively adjusting a phase of the radio frequency pulses and the magnetic resonance views by a RF phase increment which shifts image ghosting to an edge region of the image representation.

7. The apparatus as set forth in claim 6 further including: a field of view shifting means for selectively shifting a field of view in at least a phase encode direction to image a different region of the subject; the field of view shifting means concurrently controls the RF phase adjusting means to change the phase increment such that the ghosting remains at the edge region of the image representation.

8. The apparatus as set forth in claim 7 further including a rebinning means for shifting columns of image pixel values from one edge of the image representation to an opposite edge.

9. The apparatus as set forth in claim 6 wherein the radio frequency transmitter means includes a digital transmitter.

10. The apparatus as set forth in claim 6 wherein the radio frequency receiver includes a digital receiver.

11. A method of diagnostic imaging, the method comprising:
- (a) applying a radio frequency excitation pulse for inducing magnetic resonance of selected dipoles within an examination region);
- (b) applying a phase encode gradient after the radio frequency excitation pulse to phase encode the induced magnetic resonance;
- (c) after applying the phase encode gradient, refocusing the magnetic resonance to cause a magnetic resonance echo;
- (d) converting the magnetic resonance echo into a view of magnetic resonance data;
- (e) repeating steps (a)-(d) with each of a plurality of phase encode gradients to generate a plurality of different phase encoded views;
- (f) reconstructing the plurality of views into an image representation;
- (g) selectively incrementing a phase of the RF excitation pulse and the received magnetic resonance views by an RF phase increment such that ghosts are collapsed into a line and the line is shifted to an edge of image representation, the RF phase increment being the same in each repetition of steps (a)-(d).

* * * * *